(12) United States Patent
Choi et al.

(10) Patent No.: US 8,068,347 B2
(45) Date of Patent: *Nov. 29, 2011

(54) PRINTED CIRCUIT BOARD HAVING EMBEDDED RF MODULE POWER STAGE CIRCUIT

(75) Inventors: Don Chul Choi, Incheon (KR); Jae Cheol Ju, Gyeonggi-do (KR); Dong Hwan Lee, Gyeonggi-do (KR); Sang Soo Park, Gyeonggi-do (KR); Hee Soo Yoon, Gyeonggi-do (KR)

(73) Assignee: Samsung Electro-Mechanics Co., Ltd, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/436,996

(22) Filed: May 7, 2009

(65) Prior Publication Data
US 2009/0268419 A1 Oct. 29, 2009

Related U.S. Application Data

(62) Division of application No. 11/449,408, filed on Jun. 7, 2006, now Pat. No. 7,663,892.

(30) Foreign Application Priority Data

Jun. 22, 2005 (KR) .................. 10-2005-0054064

(51) Int. Cl.
*H05K 1/16* (2006.01)
(52) U.S. Cl. ........ 361/766; 361/763; 361/765; 361/794; 361/795
(58) Field of Classification Search .......... 361/763–766, 361/794–795, 803
See application file for complete search history.

(56) References Cited

U.S. PATENT DOCUMENTS

| | | | |
|---|---|---|---|
| 6,714,422 B2 * | 3/2004 | Ogawa et al. | 361/793 |
| 7,004,984 B2 * | 2/2006 | Fukuta et al. | 29/623.3 |

* cited by examiner

*Primary Examiner* — Tuan T Dinh
(74) *Attorney, Agent, or Firm* — Gottlieb, Rackman & Reisman, P.C.

(57) ABSTRACT

Disclosed herein is a printed circuit board having an RF module power stage circuit embedded therein. Specifically, this invention relates to a printed circuit board having an RF module power stage circuit embedded therein, in which a terminal pad for a resistor, a bead, or an inductor is defined or formed on a power supply plane of a multilayered wired board to connect the resistor, the bead, or the inductor to the power supply plane, and the resistor, the bead, or the inductor is connected in parallel with a decoupling capacitor by using a via hole or by embedding the resistor, the bead or the inductor perpendicular to the power supply plane, thus decreasing the size of the RF module and improving the performance thereof.

4 Claims, 13 Drawing Sheets

PRINTED CIRCUIT BOARD HAVING EMBEDDED RF MODULE POWER STAGE CIRCUIT

This application is a Divisional of U.S. Ser. No. 11/449,408 filed Jun. 7, 2006, now U.S. Pat. No. 7,663,892, which claims priority from the KR 10-2005-0054064 filed Jun. 22, 2005, the contents of which are incorporated herein by reference.

BACKGROUND OF THE INVENTION

1. Field of the Invention

The present invention relates, generally, to a printed circuit board (PCB) having an RF module power stage circuit embedded therein, and more particularly, to a PCB having an RF module power stage circuit embedded therein, in which a terminal pad for a resistor, a bead, or an inductor is defined or formed on a power supply plane of a multilayered wired board to connect the resistor, the bead, or the inductor to the power supply plane, and the resistor, the bead, or the inductor is connected in parallel with a decoupling capacitor by using a via hole or by embedding the resistor, the bead or the inductor perpendicular to the power supply plane, thus decreasing the size of the RF module and improving the performance thereof.

2. Description of the Related Art

In order to correspond to requirements for miniaturization and high functionality of electronic products according to the recent development of electronic industries, electronic techniques have been developed to insert a resistor, a capacitor, and an IC (Integrated Circuit) into a substrate.

Although a discrete chip resistor or a discrete chip capacitor has been mounted on the surface of a PCB to date, the development of PCBs in which passive devices such as resistors or capacitors are embedded has been under study in recent years.

That is, techniques for fabricating a PCB having an embedded passive device are intended to substitute for a conventional chip resistor or chip capacitor by inserting a passive device into the outer layer or inner layer of the PCB using new materials and processes.

In the PCB having an embedded passive device, in which the passive device is inserted into the outer layer or inner layer of the PCB, when the passive device is incorporated into part of the PCB regardless of the size of the PCB, it is referred to as an 'embedded passive device'. Such a substrate is called an 'embedded passive device PCB'.

The most important characteristic of the embedded passive device PCB is that the passive device, such as the resistor or capacitor, is intrinsically provided in the PCB, without the need for mounting a discrete passive device on the surface of the PCB.

According to technical trends of embedded passive device PCBs in recent years, thorough research into techniques for realizing an embedded decoupling capacitor in a flip chip package substrate for high-speed products has been conducted. In this regard, a method of fabricating a flip chip substrate having an embedded capacitor was disclosed in U.S. Pat. No. 6,407,929, which was granted to Intel Corporation.

FIGS. 1A to 1K illustrate a process of fabricating a flip chip substrate having an embedded capacitor, which was patented by Intel Corporation.

FIGS. 1A to 1E illustrate a process of fabricating a silicon chip capacitor, and FIGS. 1F to 1K illustrate a process of fabricating a package substrate including an embedded capacitor by mounting the capacitor in the package.

As shown in FIG. 1A, a silicon substrate 101 is prepared, and as shown in FIG. 1B, titanium or titanium nitride is deposited on the silicon substrate 101 to form a barrier layer 102.

As shown in FIG. 1C, platinum, palladium, tungsten, or AlSiCu is deposited on the barrier layer 102 to form a silicon chip capacitor lower electrode 103 having a thickness of 1~10 μm.

As shown in FIG. 1D, material having a high dielectric constant, such as $SrTiO_3$, $BaTiO_3$, $Pb(Zr)TiO_3$, or $Ta_2O_5$, is deposited on the lower electrode 103, thus forming a capacitor dielectric layer 104 having a thickness of 100~1000 Å.

As shown in FIG. 1E, the upper electrode 105 of the silicon chip capacitor is formed on the dielectric layer 104 using the same process for forming the lower electrode 103 of the silicon chip capacitor.

Subsequently, the silicon chip capacitor, having a thickness of 30~150 μm, is mounted on an electronic package having a plurality of via holes and conductive material deposited thereon, after which an insulating layer is formed, thus fabricating a flip chip package having an embedded silicon chip capacitor.

That is, as shown in FIG. 1F, the flip chip package substrate, having an electronic inner circuit in which the plurality of via holes is formed and the conductive material is deposited, is provided, and the silicon chip capacitor is mounted thereon, as shown in FIG. 1G.

In FIG. 1H, an insulating layer 109 having a thickness of 80~150 μm is formed on the silicon chip capacitor mounted in FIG. 1G.

In FIG. 1I, the insulating layer 109 is subjected to laser cutting to form via holes 110 having a diameter of 50~300 μm.

In FIG. 1J, in order to electrically connect the upper electrode 105 of the silicon chip capacitor, conductive material 112 is deposited. FIG. 1K is a cross-sectional view showing the electronic package provided with an embedded capacitor using a build-up process.

In addition to U.S. Pat. No. 6,407,929, granted to Intel Corporation, conventional techniques related to the embedded passive device PCB comprise Japanese Patent Laid-open Publication No. 1995-115277 regarding 'layered ceramic part', Japanese Patent Laid-open Publication No. 2002-344146 regarding 'high-frequency module and fabrication method thereof', and Japanese Patent Laid-open Publication No. 2004-056144 regarding 'printed circuit board'.

Such conventional techniques are used to realize an embedded decoupling capacitor in a flip chip package substrate for high-speed products. However, techniques for embedding a resistor or bead linked with a decoupling capacitor in order to improve the performance of the power stage of an RF IC having a high degree of integration are not well developed yet.

SUMMARY OF THE INVENTION

In order to solve the problems encountered in the prior art, an object of the present invention is to provide a PCB in which a resistor or bead, linked with a decoupling capacitor, is embedded in order to improve the performance of the power stage of an RF IC having a high degree of integration.

With the goal of accomplishing the above object, the present invention provides a PCB having an RF module power stage circuit embedded therein, comprising a power supply plane, which is formed in a multilayered printed circuit board, includes a connection pad electrically insulated therefrom, and is connected to an outer power supply line; a first device, one terminal of which is placed on the connection pad of the power supply plane, and the other terminal of which is placed on the power supply plane; and a second device, which is formed in the multilayered printed circuit board, is connected to the first device through a first connection via hole, and is connected to an RF IC module mounted in the multilayered printed circuit board through a second connection via hole.

In addition, the present invention provides a PCB having an RF module power stage circuit embedded therein, comprising a power supply plane, which is formed in a multilayered printed circuit board, is connected to an outer power supply line, and has a connection pad region defined therein; a first device, one terminal of which is placed on the connection pad region of the power supply plane, which is provided perpendicular to the power supply plane; and a second device, which is formed in the multilayered printed circuit board, is connected to the other terminal of the first device, and is connected to an RF IC module mounted in the multilayered printed circuit board through a connection via hole.

In addition, the present invention provides a PCB having an RF module power stage circuit embedded therein, comprising a power supply plane, which is formed in a multilayered printed circuit board, includes a connection pad electrically insulated therefrom, and is connected to an outer power supply line; a first device, one terminal of which is placed on the connection pad of the power supply plane, and the other terminal of which is placed on the power supply plane; a second device, which is formed in the multilayered printed circuit board, is connected to the first device through a first connection via hole, and is connected to an RF IC module mounted in the multilayered printed circuit board through a second connection via hole; and a third device, which is formed in the multilayered printed circuit board, is connected to the second device through a third connection via hole, and is connected to the RF IC module mounted in the multilayered printed circuit board through a fourth connection via hole.

In addition, the present invention provides a PCB having an RF module power stage circuit embedded therein, comprising a power supply plane, which is formed in a multilayered printed circuit board, is connected to an outer power supply line, and has a connection pad region defined therein; a first device, one terminal of which is placed on the connection pad of the power supply plane, which is provided perpendicular to the power supply plane; a second device, which is formed in the multilayered printed circuit board, is connected to the other terminal of the first device, and is connected to an RF IC module mounted in the multilayered printed circuit board through a first connection via hole; and a third device, which is formed in the multilayered printed circuit board, is connected to the second device through a second connection via hole, and is connected to the RF IC module mounted in the multilayered printed circuit board through a third connection via hole.

DESCRIPTION OF THE PREFERRED EMBODIMENTS

Hereinafter, a detailed description will be given of the preferred embodiment of the present invention.

An RF IC and a baseband IC constituting an RF module are typically realized to have different power stage circuits from each other. That is, in the case of the RF IC, the inhibition of high frequency coupling between different power stages integrated on a single chip is regarded as an important design process from the point of view of prevention of oscillation.

Thus, unlike the structure of the power stage of a digital IC, the RF IC realizes the above function through resistors or beads, and further functions to stabilize DC bias and acts as an RF choke.

Figure 1A:
FIGS. 1A to 1K are cross-sectional views showing a conventional process of fabricating a flip chip substrate having an embedded capacitor, which was patented by Intel Corporation.
Figure 1B:
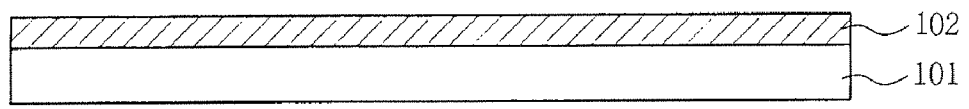
Figure 1C:
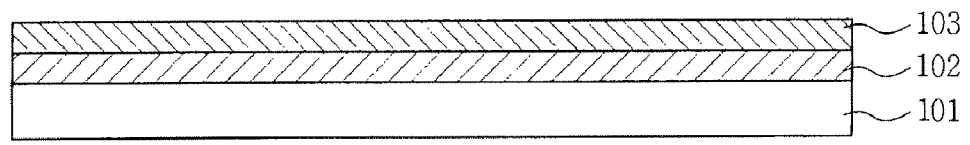
Figure 1D:
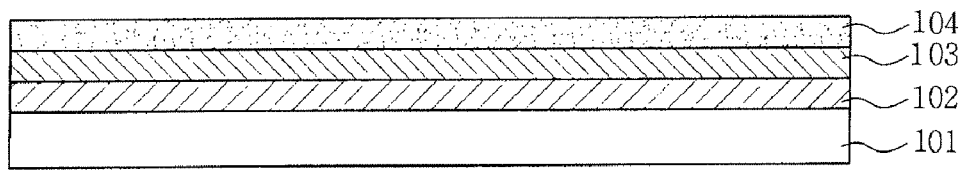
Figure 1E:
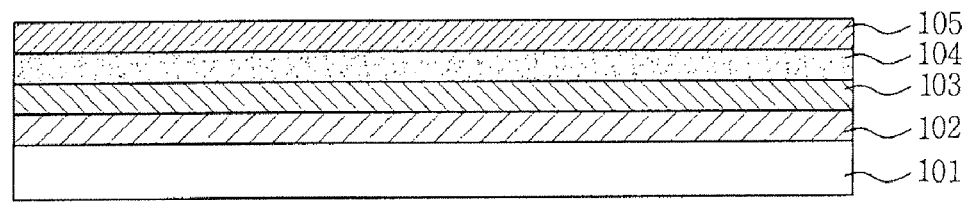
Figure 1F:
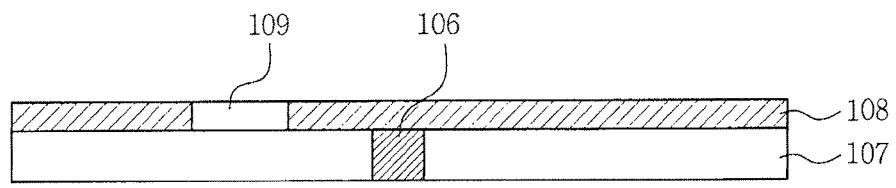
Figure 1G:
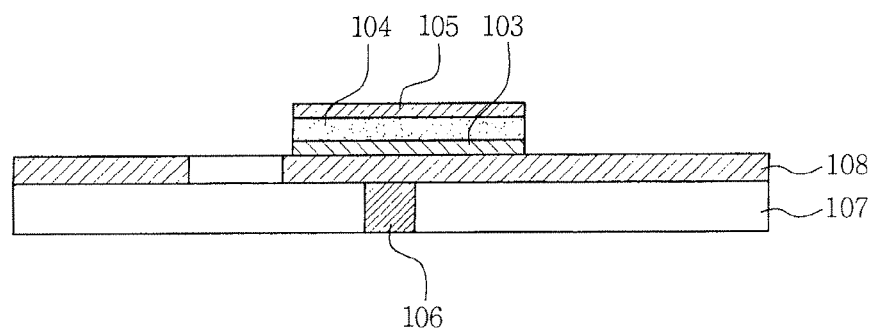
Figure 1H:
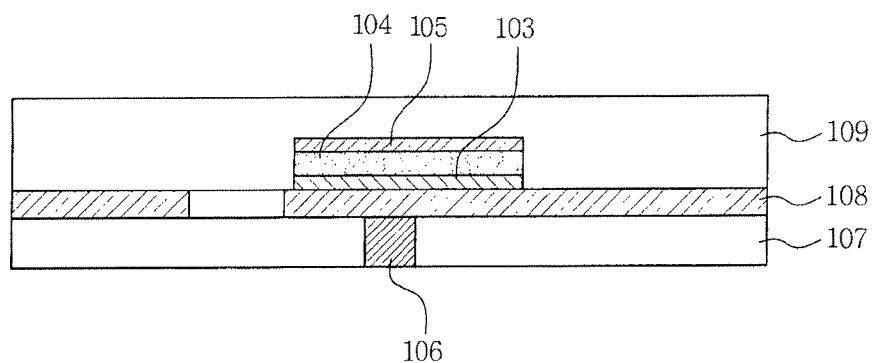
Figure 1I:
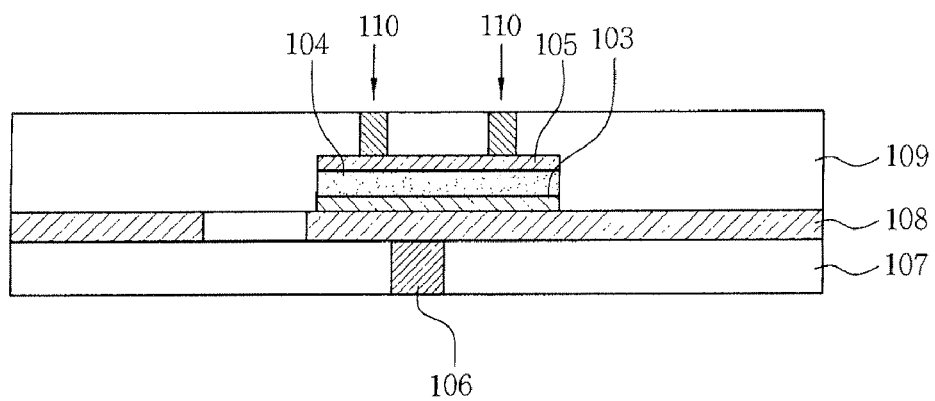
Figure 1J:
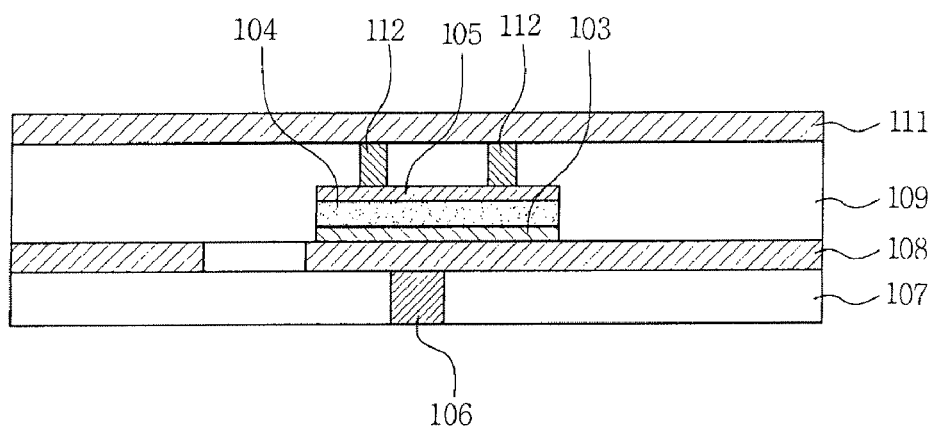
Figure 1K:
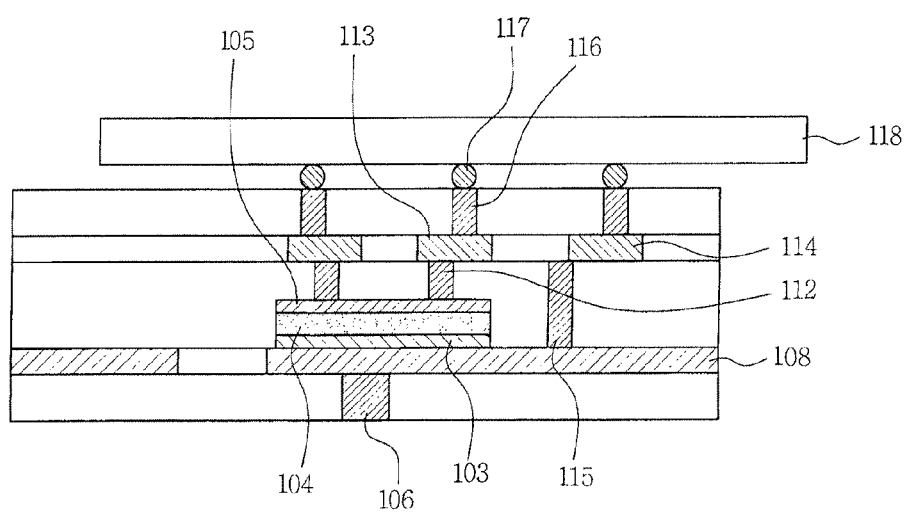
Figure 2A:
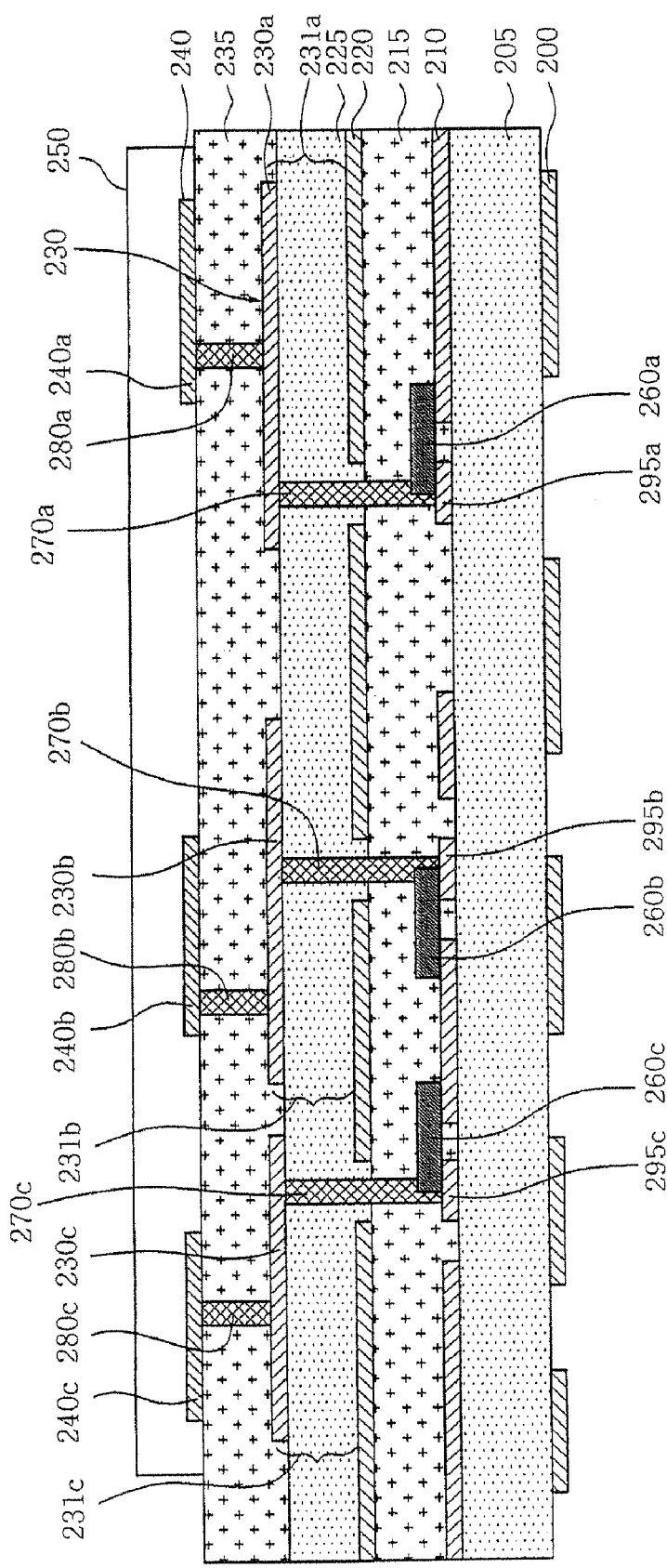
FIG. 2A is a cross-sectional view showing a PCB having an RF module power stage circuit embedded therein, according to a first embodiment of the present invention.
Figure 2B:
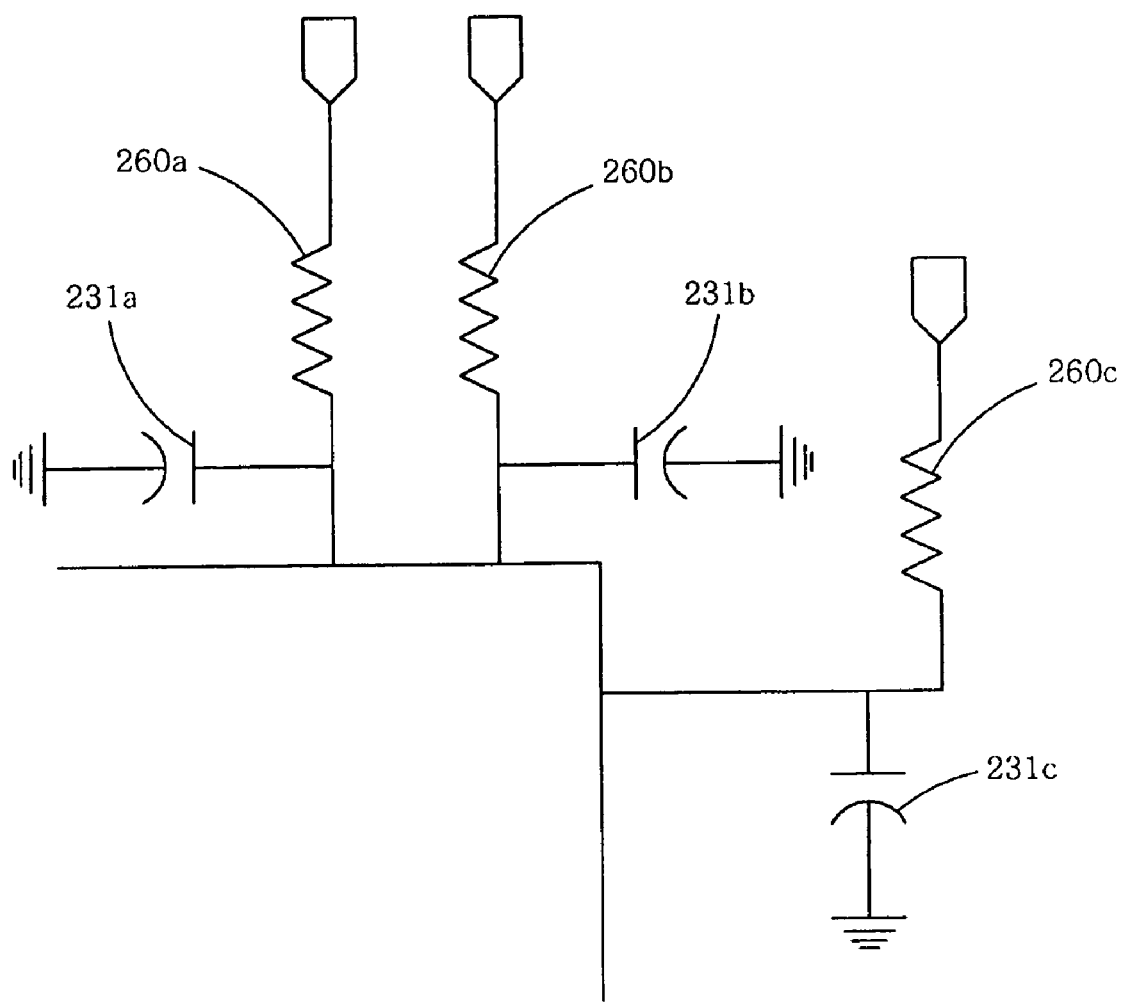
FIG. 2B is an equivalent circuit diagram of FIG. 2A.

FIG. 2A is a cross-sectional view showing a PCB having an RC power stage circuit of an RF IC embedded therein, according to a first embodiment of the present invention, and FIG. 2B is an equivalent circuit diagram of FIG. 2A.

Referring to FIG. 2A, the PCB having an RC power stage circuit of an RF IC embedded therein, according to the first embodiment of the present invention, has a power supply plane 210 and a ground plane 230, which are formed as internal layers.

Figure 3A:
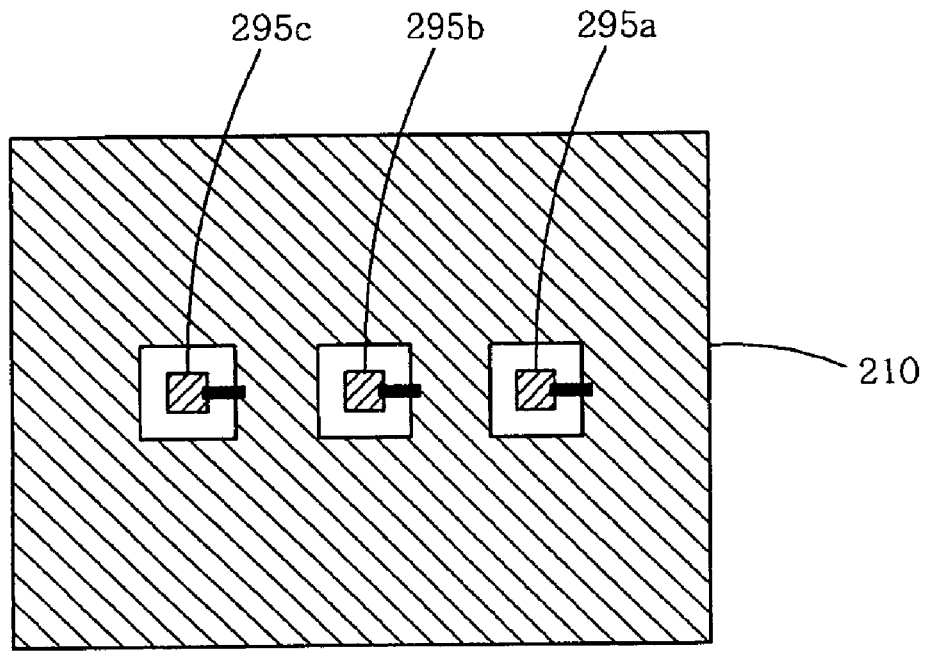
FIG. 3A is a top plan view showing a power supply plane of FIG. 2A.

As shown in FIGS. 2A and 3A, a plurality of connection pads 295a, 295b, 295c is formed in the power supply plane 210 to be isolated from the power supply plane 210.

As such, the connection pads 295a, 295b, 295c may be formed by removing the portions surrounding the connection pads 295a, 295b, 295c from the power supply plane 210 through etching.

In addition, first sides of resistors 260a, 260b, 260c are placed on respective connection pads 295a, 295b, 295c, and second sides thereof are placed on the power supply plane 210.

Figure 3B:
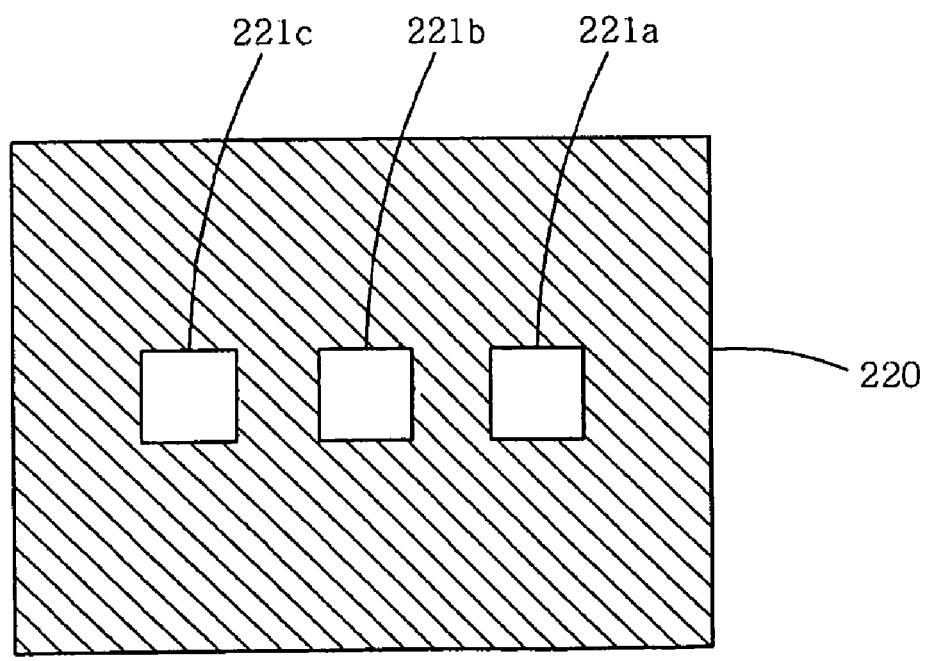
FIG. 3B is a top plan view showing a ground plane of FIG. 2B.

In order to connect the resistors 260a, 260b, 260c to decoupling capacitors 231a, 231b, 231c, first sides of connection via holes 270a, 270b, 270c are connected to respective connection pads 295a, 295b, 295c, and second sides thereof are connected to respective upper electrodes 230a, 230b, 230c of the decoupling capacitors 231a, 231b, 231c through grooves 221a, 221b, 221c of the ground plane 220, as shown in FIG. 3B.

In this way, when the connection via holes 270a, 270b, 270c are used to connect the resistors 260a, 260b, 260c to the upper electrodes 230a, 230b, 230c of the decoupling capacitors, the decoupling capacitors 231a, 231b, 231c are connected in parallel with the resistors 260a, 260b, 260c, as shown in the equivalent circuit diagram of FIG. 2B.

As such, individual decoupling capacitors 231a, 231b, 231c are composed of the ground plane 220, an insulating layer 225 having a high dielectric constant laminated on the ground plane 220, and the upper electrodes 230a, 230b, 230c formed on the insulating layer 225. When the ground plane 220 is used as a lower electrode, first sides of the decoupling capacitors 231a, 231b, 231c are grounded, as shown in FIG. 2B.

The upper electrodes 230a, 230b, 230c of the three decoupling capacitors 231a, 231b, 231c are connected to an RF IC 250 of the PCB, and more particularly, to respective RF IC pads 240a, 240b, 240c of said RF IC 250.

In addition, the connection via holes 280a, 280b, 280c function to connect the resistors 260a, 260b, 260c to the RF IC 250. Thus, when the decoupling capacitors 231a, 231b, 231c and the resistors 260a, 260b, 260c are connected to the RF IC 250 through the connection via holes 280a, 280b, 280c, the parallel connection points of the decoupling capacitors 231a, 231b, 231c and the resistors 260a, 260b, 260c are connected to the input terminal of the RF IC 250, as shown in FIG. 2B. Thereby, the PCB of FIG. 2A, in which the plurality of resistors 260a, 260b, 260c and decoupling capacitors 231a, 231b, 231c are embedded, constitutes the equivalent circuit of FIG. 2B.

Figure 4A:
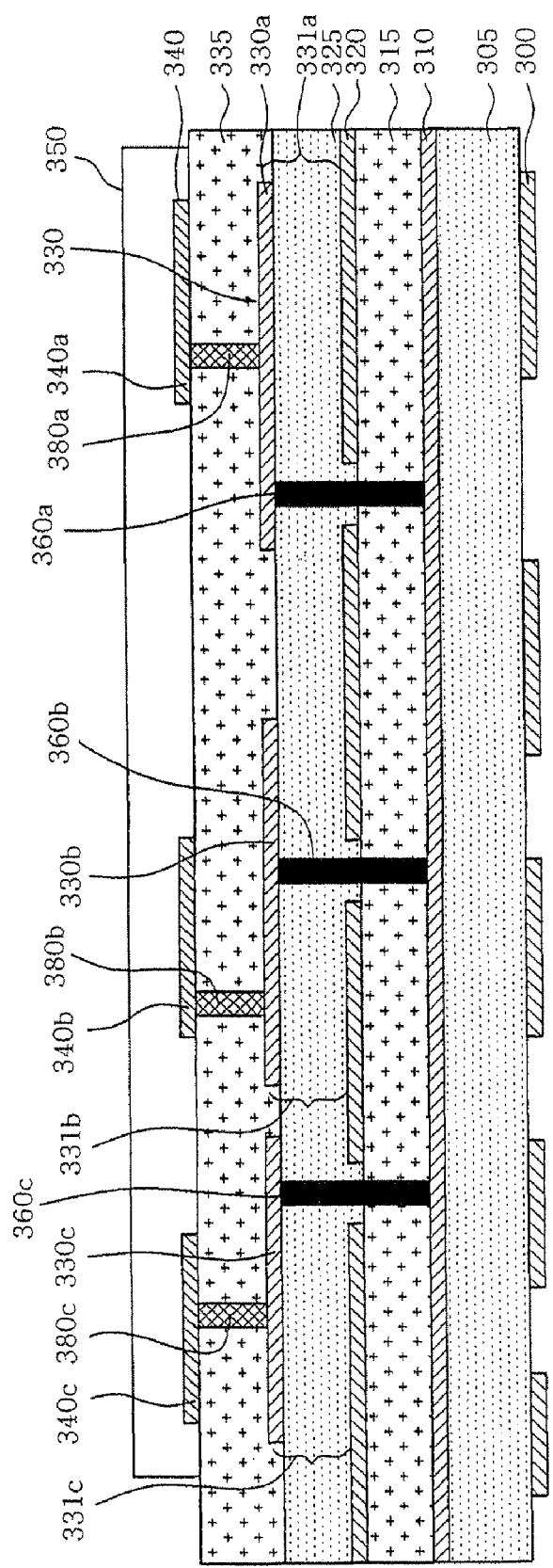
FIG. 4A is a cross-sectional view showing a PCB having an RF module power stage circuit embedded therein, according to a second embodiment of the present invention.
Figure 4B:
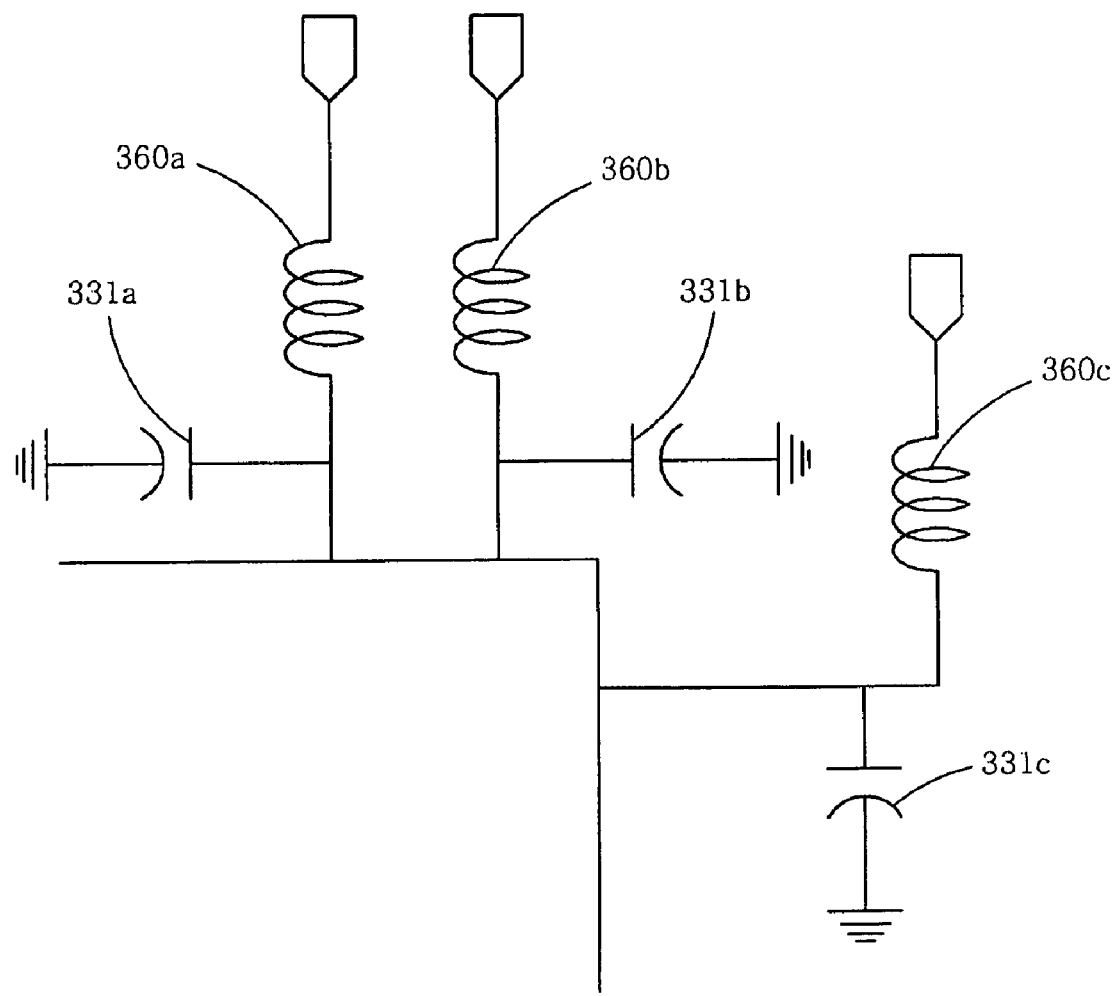
FIG. 4B is an equivalent circuit diagram of FIG. 4A.

FIG. 4A is a cross-sectional view showing a PCB having an LC power stage circuit of an RF IC embedded therein, according to a second embodiment of the present invention, and FIG. 4B is an equivalent circuit diagram of FIG. 4A.

Figure 5A:
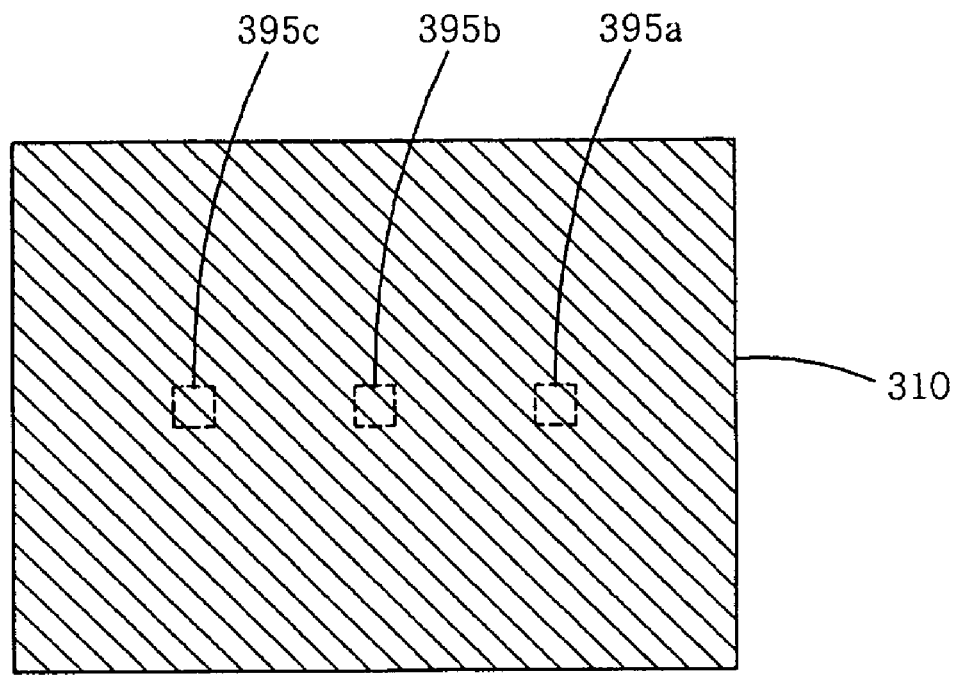
FIG. 5A is a top plan view showing a power supply plane of FIG. 4A.

Referring to FIG. 4A, the PCB having an LC power stage circuit of an RF IC embedded therein, according to the second embodiment of the present invention, has a power supply plane 310 and a ground plane 330, which are formed as internal layers. As such, in the power supply plane 310, a plurality of connection pad regions 395a, 395b, 395c is defined, as shown in FIGS. 4A and 5A.

Figure 5B:
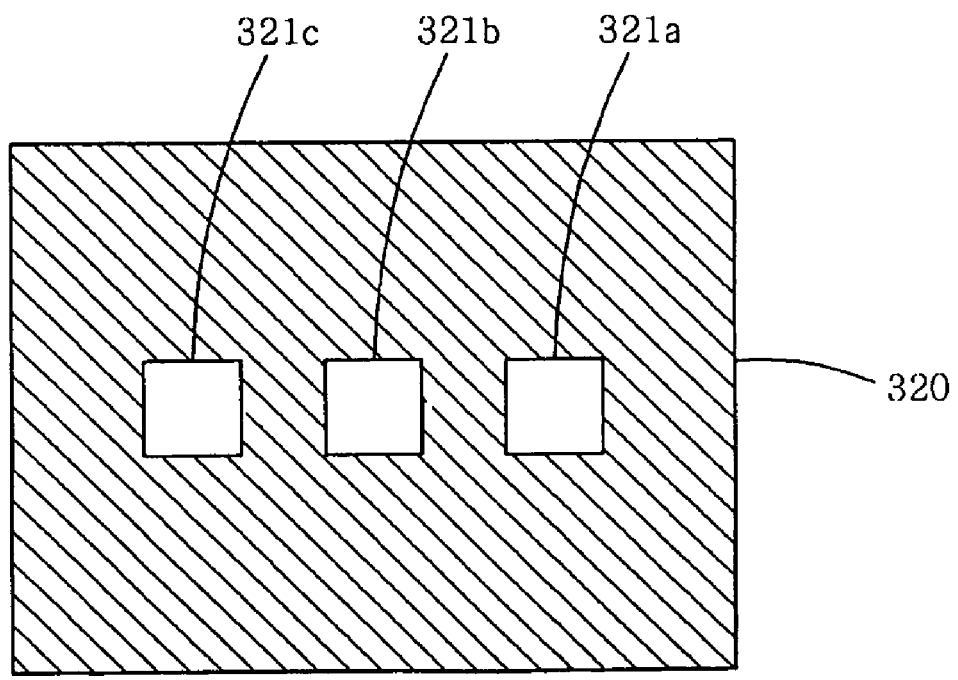
FIG. 5B is a top plan view showing a ground plane of FIG. 4B.

Unlike the first embodiment shown in FIG. 2A, according to the second embodiment, inductors 360a, 360b, 360c are formed perpendicular to the power supply plane 310, and are connected to upper electrodes 330a, 330b, 330c of decoupling capacitors 331a, 331b, 331c through grooves of the ground plane 320 of FIG. 5B, as shown in FIG. 3B.

In this way, when first sides of the inductors 360a, 360b, 360c are connected to respective connection pad regions 395a, 395b, 395c of the power supply plane 310 and second sides thereof are connected to the upper electrodes 330a, 330b, 330c of the decoupling capacitors 331a, 331b, 331c, the inductors 360a, 360b, 360c and the decoupling capacitors 331a, 331b, 331c are connected in parallel with each other, respectively, as shown in the equivalent circuit diagram of FIG. 4B.

As such, individual decoupling capacitors 331a, 331b, 331c are composed of the ground plane 320, an insulating layer 325 having a high dielectric constant laminated on the ground plane 320, and the upper electrodes 330a, 330b, 330c formed on the insulating layer 325. When the ground plane 320 is used as a lower electrode, first sides of the decoupling capacitors 331a, 331b, 331c are grounded, as shown in FIG. 4B The upper electrodes 330a, 330b, 330c of the three decoupling capacitors 331a, 331b, 331c are connected to an RF IC 350 through connection via holes 380a, 380b, 380c.

Further, the connection via holes 380a, 380b, 380c respectively function to connect the inductors 360a, 360b, 360c to the RF IC 350. When the decoupling capacitors 331a, 331b, 331c and the inductors 360a, 360b, 360c are connected to the RF IC 350 through the connection via holes 380a, 380b, 380c, the parallel connection points of the decoupling capacitors 331a, 331b, 331c and the inductors 360a, 360b, 360c are connected to the input terminal of the RF IC 350, as shown in FIG. 4B. Thereby, the PCB of FIG. 4A, in which the inductors 360a, 360b, 360c and decoupling capacitors 331a, 331b, 331c are embedded, constitutes the equivalent circuit of FIG. 4B.

According to the second embodiment, unlike the first embodiment, additional connection pads, which are isolated from the power supply plane 310, are not formed in the power supply plane 310, and the inductors 360a, 360b, 360c are provided perpendicularly to form a circuit. However, as in the first embodiment, additional connection pads, which are isolated from the power supply plane 310, may be formed in the power supply plane 310, and then first sides of the inductors 360a, 360b, 360c may be connected to the additional connection pads and second sides thereof may be connected to the power supply plane 310, thus forming a circuit. In addition, in the first embodiment, the circuit may be formed in a manner such that additional connection pads 295a, 295b, 295c are not formed in the power supply plane 210, and the resistors 260a, 260b, 260c are provided perpendicular to the power supply plane 210, as in the second embodiment.

Figure 6A:
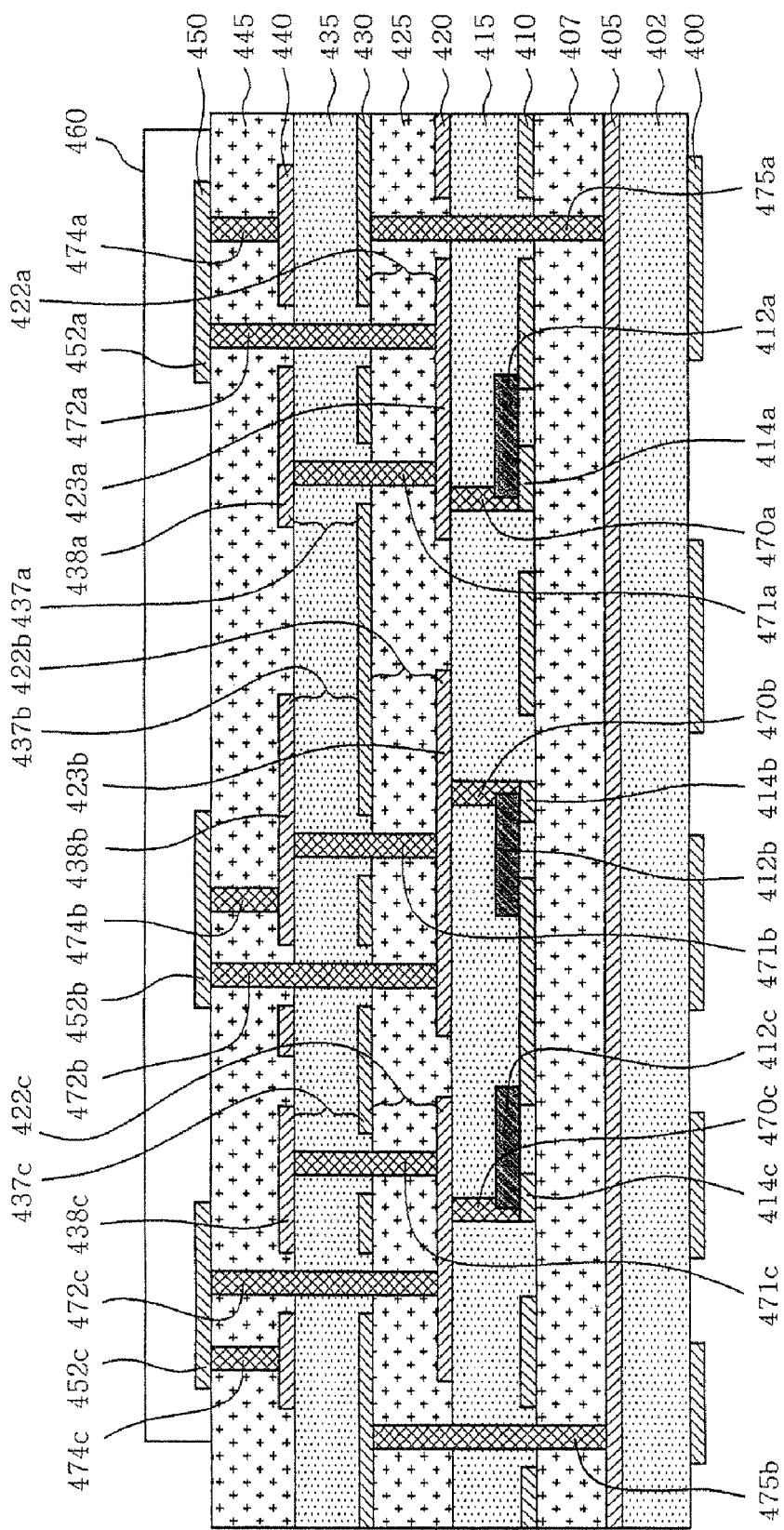
FIG. 6A is a cross-sectional view showing a PCB having an RF module power stage circuit embedded therein, according to a third embodiment of the present invention.
Figure 6B:
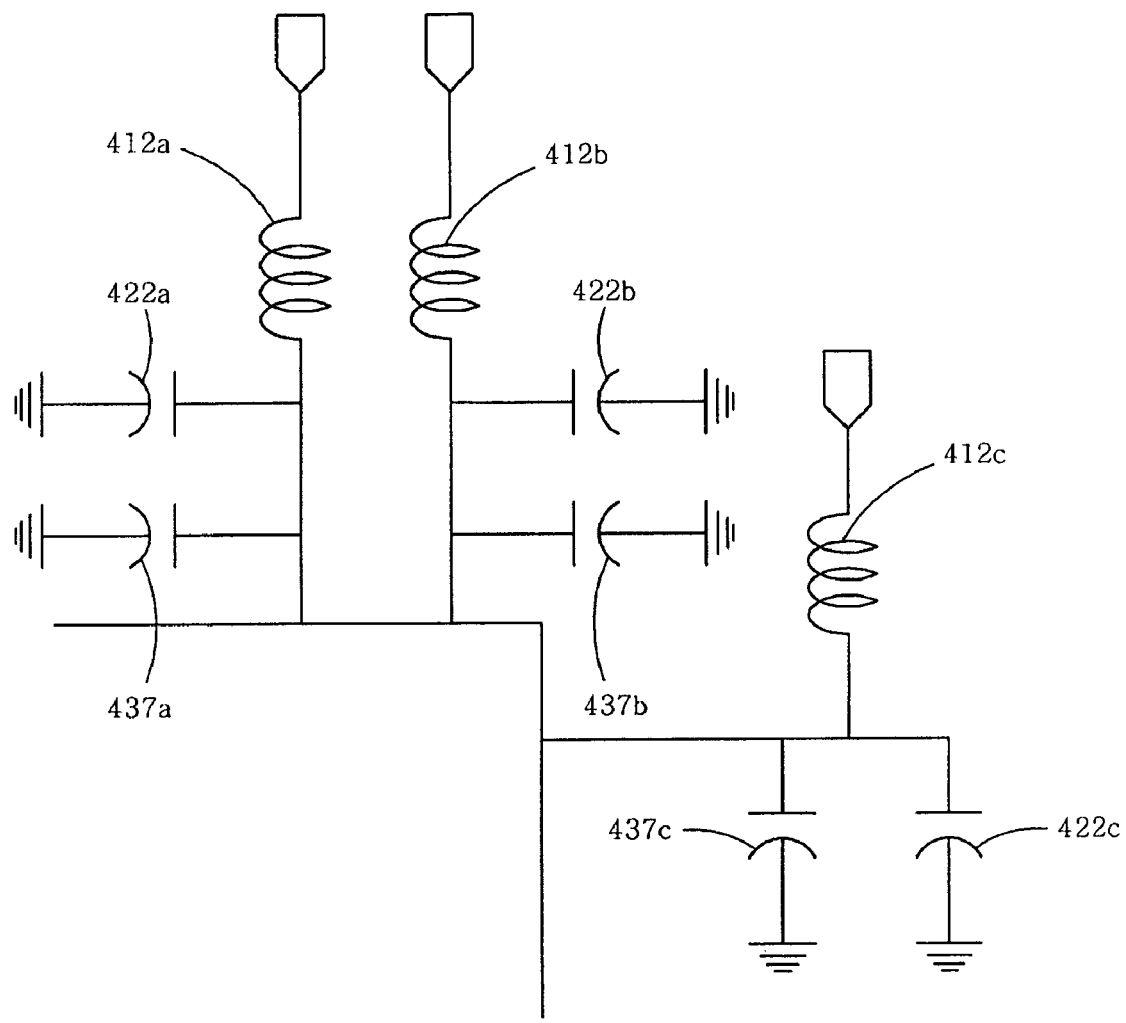
FIG. 6B is an equivalent circuit diagram of FIG. 6A.

FIG. 6A is a cross-sectional view showing a PCB having an embedded RF power stage, according to a third embodiment of the present invention, and FIG. 6B is an equivalent circuit diagram of FIG. 6A.

Referring to FIG. 6A, the PCB having an RC power stage circuit of an RF IC embedded therein, according to the third embodiment of the present invention, is composed of a first ground plane 405, a power supply plane 410, a first decoupling capacitor power supply plane 420, a second ground plane 430, and a second decoupling capacitor power supply plane 440, which are formed as internal layers.

The first ground plane 405 and the second ground plane 430 are connected to each other through connection via holes 475a, 475b, thus maintaining the same ground voltage.

Figure 7:
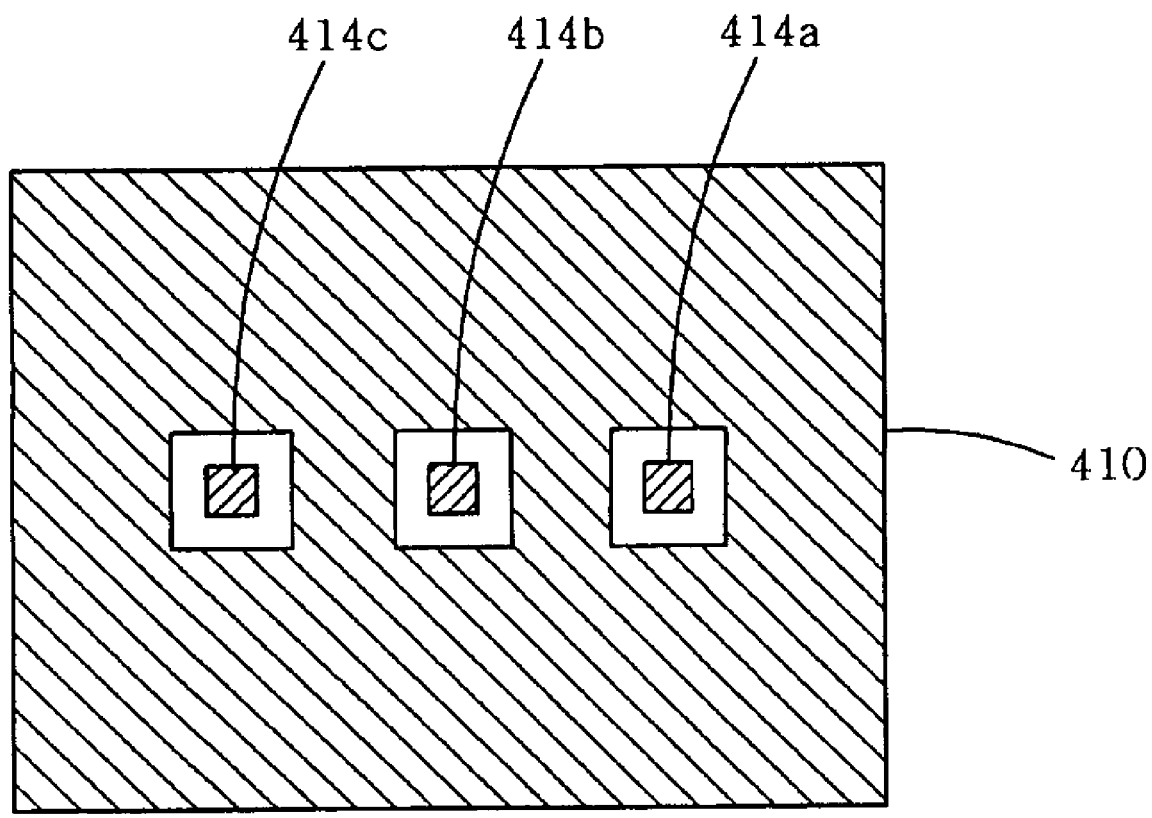
FIG. 7 is a top plan view showing a power supply plane of FIG. 6A.

Further, a plurality of connection pads 414a, 414b, 414c is formed in the power supply plane 410 to be isolated from the power supply plane 410, as shown in FIGS. 6A and 7.

Such connection pads 414a, 414b, 414c may be formed by removing the portions surrounding the connection pads 414a, 414b, 414c from the power supply plane 410 through etching.

First sides of the inductors 412a, 412b, 412c are placed on respective connection pads 414a, 414b, 414c, and second sides thereof are placed on the power supply plane 410.

In order to connect the inductors 412a, 412b, 412c to upper electrode surfaces 423a, 423b, 423c of respective decoupling capacitors 422a, 422b, 422c provided on the first decoupling capacitor power supply plane 420, first sides of the connection via holes 470a, 470b, 470c are connected to respective connection pads 414a, 414b, 414c, and second sides thereof are connected to the upper electrodes 423a, 423b, 423c of the decoupling capacitors.

In this way, when the connection via holes 470a, 470b, 470c are used to connect the inductors 412a, 412b, 412c to the upper electrodes 423a, 423b, 423c of the decoupling capacitors, the decoupling capacitors 422a, 422b, 422c are connected in parallel with the inductors 412a, 412b, 412c, respectively, as can be seen in the equivalent circuit diagram of FIG. 6B.

As such, individual decoupling capacitors 422a, 422b, 422c are composed of the first decoupling power supply plane 420, the second ground plane 430, and an insulating layer 425 having a high dielectric constant formed between the first decoupling power supply plane 420 and the second ground plane 430.

In addition, the first decoupling capacitor power supply plane 420 and the second decoupling capacitor power supply plane 440 are connected to each other through other connection via holes 472a, 472b, 472c, such that the decoupling capacitors 422a, 422b, 422c placed under the second ground plane 430 are connected in parallel with decoupling capacitors 437a, 437b, 437c placed above the second ground plane 430, as can be seen in the equivalent circuit diagram of FIG. 6B.

Individual decoupling capacitors 437a, 437b, 437c placed above the second ground plane 430 include the second ground plane 430, an insulating layer 435 having a high dielectric constant formed on the second ground plane 430, and upper electrodes 438a, 438b, 438c of the second decoupling capacitor power supply plane 440 formed on the insulating layer 435. In this way, when the second ground plane 430 is used as the lower electrode, first sides of the decoupling capacitors 437a, 437b, 437c are grounded, as shown in FIG. 6B.

The upper electrodes 423a, 423b, 423c of the three decoupling capacitors 422a, 422b, 422c provided under the second ground plane 430 are connected to an RF IC 460 through the connection via holes 472a, 472b, 472c.

The upper electrodes 438a, 438b, 438c of the three decoupling capacitors 437a, 437b, 437c provided above the second ground plane 430 are connected to the RF IC 460 through connection via holes 474a, 474b, 474c.

Further, the connection via holes 472a, 472b, 472c function to connect the inductors 412a, 412b, 412c to the RF IC 460. Thus, when the decoupling capacitors 422a, 422b, 422c, 437a, 437b, 437c and the inductors 412a, 412b, 412c are connected to the RF IC 460 through the connection via holes 472a, 472b, 472c, 474a, 474b, 474c, the parallel connection points of the decoupling capacitors 422a, 422b, 422c, 437a, 437b, 437c and the inductors 412a, 412b, 412c are connected to the input terminal of the RF IC 460, as shown in FIG. 6B. Thereby, the PCB of FIG. 6A, in which the plurality of inductors 412a, 412b, 412c and decoupling capacitors 422a, 422b, 422c, 437a, 437b, 437c is embedded, constitutes the equivalent circuit of FIG. 6B.

As described hereinbefore, the present invention provides a PCB having an RF module power stage circuit embedded therein. According to the present invention, decoupling capacitors, resistors, beads, or inductors, which are provided around an RF IC, are embedded in an RF IC package substrate, therefore minimizing parasitic inductance, resulting in high power stage stability.

In addition, according to the present invention, decoupling capacitors, resistors, beads, or inductors, which are provided around the RF IC, are embedded in the RF IC package substrate, therefore decreasing the size of the RF module.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A printed circuit board having an RF IC power stage embedded therein, comprising:
   a power supply plane, which is formed in a multilayered printed circuit board that several insulation and circuit layers are laminated by turns, has a connection pad region defined therein;
   a first device, one terminal of which is placed on the connection pad region of the power supply device, which is provided perpendicular to the power supply plane, penetrating to a first insulation layer which is connected to the power supply plane, a first circuit layer which is connected to the first insulation layer, and a second insulation layer which is connected to the first circuit layer and other terminal is connected to a second circuit layer which is connected to the second insulation layer; and,
   a second device, which is formed in the multilayered printed circuit board and the first circuit layer, the second insulation layer and the second circuit layer which is the different layer form the power supply plane, wherein one terminal is connected to the other terminal of the first device formed perpendicular to the power supply plane, and other terminal is connected to an RF IC mounted in the surface of the multilayered printed circuit board through a second connection via hole.

2. The printed circuit board as set forth in claim 1, wherein the first device is a resistor.

3. The printed circuit board as set forth in claim 1, wherein the first device is an inductor.

4. The printed circuit board as set forth in claim 1, wherein the second device comprises:
   a first electrode formed in the multilayered printed circuit board;
   a dielectric layer laminated on the first electrode; and
   a second electrode formed on the dielectric layer.

* * * * *